(12) United States Patent
Xie

(10) Patent No.: US 11,233,153 B2
(45) Date of Patent: Jan. 25, 2022

(54) THIN FILM TRANSISTOR, DISPLAY PANEL AND FABRICATING METHOD THEREOF

(71) Applicant: Shenzhen China Star Optoelectronics Semiconductor Display Technology Co., Ltd., Shenzhen (CN)

(72) Inventor: Huafei Xie, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 21 days.

(21) Appl. No.: 16/621,250

(22) PCT Filed: Nov. 7, 2019

(86) PCT No.: PCT/CN2019/116296
§ 371 (c)(1),
(2) Date: Dec. 11, 2019

(87) PCT Pub. No.: WO2021/077470
PCT Pub. Date: Apr. 29, 2021

(65) Prior Publication Data
US 2021/0202750 A1    Jul. 1, 2021

(30) Foreign Application Priority Data
Oct. 25, 2019   (CN) .......................... 201911024849.1

(51) Int. Cl.
*H01L 29/786* (2006.01)
*G02F 1/1335* (2006.01)
(Continued)

(52) U.S. Cl.
CPC .. *H01L 29/78618* (2013.01); *G02F 1/133516* (2013.01); *G02F 1/136286* (2013.01);
(Continued)

(58) Field of Classification Search
CPC ......... H01L 29/78618; H01L 29/66742; H01L 29/42384; H01L 29/4908; H01L 29/78678;
(Continued)

(56) References Cited

U.S. PATENT DOCUMENTS

| 2009/0214956 A1* | 8/2009 | Prieto | ................. H01M 10/052 429/310 |
| 2013/0001689 A1* | 1/2013 | Sambandan | ...... H01L 29/42384 257/347 |

(Continued)

FOREIGN PATENT DOCUMENTS

| CN | 105097475 | 11/2015 |
| CN | 106549041 | 3/2017 |

(Continued)

OTHER PUBLICATIONS

Kibuule et al. CMOS Effective Channel Size Measurements. Superconducting Super Collider Laboratory, Dallas, TX, pp. 1-6 (Year: 1994).*

*Primary Examiner* — Galina G Yushina

(57) ABSTRACT

The invention discloses a thin film transistor, a display panel and a method of fabricating the thin film transistor. The thin film transistor includes a substrate, a flat film, a dielectric layer, an active layer, and a source/drain layer which are stacked in sequence from bottom to top; and a plurality of reinforcing portions are disposed on an upper surface of the flat film, wherein the flat film and the reinforcing portions constitute a gate layer, wherein the reinforcing portions are configured to increase an area of the upper surface of the flat film, so as to increase an effective overlapping area between the flat film and the active layer, and reduce a width and a length of the thin film transistor.

10 Claims, 4 Drawing Sheets

(51) Int. Cl.
    *H01C 17/00*     (2006.01)
    *H01L 21/02*     (2006.01)
    *H01L 21/027*     (2006.01)
    *H01L 29/423*     (2006.01)
    *H01L 29/49*     (2006.01)
    *H01L 29/66*     (2006.01)
    *G02F 1/1362*     (2006.01)

(52) U.S. Cl.
    CPC ..... *H01C 17/003* (2013.01); *H01L 21/02019* (2013.01); *H01L 21/02052* (2013.01); *H01L 21/0273* (2013.01); *H01L 21/02266* (2013.01); *H01L 29/42384* (2013.01); *H01L 29/4908* (2013.01); *H01L 29/66742* (2013.01); *H01L 29/78678* (2013.01); *H05K 2203/092* (2013.01)

(58) Field of Classification Search
    CPC ......... H01L 21/02266; H01L 21/02617; H01L 21/02041; H01L 21/02052; H01L 21/0273; G02F 1/133516; H01C 17/003; H05K 2203/092
    See application file for complete search history.

(56) References Cited

U.S. PATENT DOCUMENTS

| | | | |
|---|---|---|---|
| 2014/0193289 | A1* | 7/2014 | Chen .................... C30B 29/602 |
| | | | 420/417 |
| 2015/0206982 | A1* | 7/2015 | Moon .................. H01L 27/124 |
| | | | 257/72 |
| 2015/0255618 | A1* | 9/2015 | Chen ...................... H01L 29/45 |
| | | | 257/43 |
| 2016/0351724 | A1 | 12/2016 | Zhao et al. |
| 2017/0288060 | A1* | 10/2017 | Park .................... H01L 29/7869 |
| 2018/0026067 | A1* | 1/2018 | Lee .................. H01L 27/14636 |
| | | | 257/777 |
| 2018/0294361 | A1* | 10/2018 | An ........................ G02F 1/1368 |
| 2020/0006395 | A1* | 1/2020 | Sugawara ........... H01L 27/1285 |

FOREIGN PATENT DOCUMENTS

| | | |
|---|---|---|
| KR | 2002-0091695 | 12/2002 |
| WO | WO 2016/123931 | 8/2016 |

* cited by examiner

THIN FILM TRANSISTOR, DISPLAY PANEL AND FABRICATING METHOD THEREOF

RELATED APPLICATIONS

This application is a National Phase of PCT Patent Application No. PCT/CN2019/116296 having International Filing Date of Nov. 7, 2019, which claims the benefit of priority of Chinese Patent Application No. 201911024849.1 filed on Oct. 25, 2019. The contents of the above applications are all incorporated by reference as if fully set forth herein in their entirety.

FIELD AND BACKGROUND OF THE INVENTION

The present invention relates to a field of display, and in particular, to a thin film transistor, a display panel, and a method of fabricating a thin film transistor.

Currently, in a thin film transistor (TFT) device, an active layer achieves conduction or disconnection of a source and a drain by regulating voltage of a gate. The gate can be considered as a switch that controls a physical gate. The gate is disposed corresponding to the active layer of a semiconductor material. A voltage applied to the gate attracts electrons in a doped semiconductor of the active layer, and as the gate voltage increases, the electrons in the semiconductor are suddenly increased to form a channel in the active layer, so that the source and the drain at opposite ends of the active layer are in conduction. Formation or elimination of the channel is controlled by voltage applied to the gate, thereby allowing or hindering flow of electrons. In display applications, the gate also functions to block light from entering the active layer to reduce impact of light on the active layer. However, the gate that is too wide may reduce transmittance of the thin film transistor device and increase a parasitic capacitance of the display panel, thereby reducing display performance.

Therefore, there is a need to develop a new type of thin film transistor, display panel and method of fabricating thin film transistor to overcome the defects in the prior art.

SUMMARY OF THE INVENTION

An object of the present invention is to provide a thin film transistor, a display panel, and a method of fabricating a thin film transistor. By changing a structure of a gate of the thin film transistor, an area occupied by the flat film is reduced without impacting conductivity of the active layer, such that transmittance of the display panel is increased, and a parasitic capacitance of the display panel is reduced, thus improving the performance of the thin film transistor and the display panel.

In order to achieve the above object, the present invention provides a thin film transistor including a substrate, a flat film, a dielectric layer, an active layer, and a source/drain layer which are stacked in sequence from bottom to top. Specifically, the flat film disposed on the substrate, wherein a plurality of reinforcing portions are disposed on an upper surface of the flat film, the flat film and the reinforcing portions constitute a gate layer; the dielectric layer disposed on the flat film and the reinforcing portions and completely covering the flat film and the reinforcing portions; the active layer disposed on the dielectric layer and completely covering the dielectric layer; the a source/drain layer disposed on the active layer and electrically connected to the active layer, the source/drain layer including a source electrode and a drain electrode, the source electrode disposed at one end of the active layer, and the drain electrode disposed at another end of the active layer; wherein the reinforcing portions are configured to increase an area of the upper surface of the flat film, so as to increase an effective overlapping area between the flat film and the active layer, and reduce a width and a length of the thin film transistor, and reduce a parasitic capacitance of the thin film transistor.

Further, the reinforcing portions are arranged in an array on the flat film.

Further, the reinforcing portions have a shape selected from any one of a column shape, a strip shape, and a mesh shape.

Further, the thin film transistor further includes a stop layer disposed on the active layer, wherein the source electrode is disposed at one end of each of the active layer and the stop layer, and the drain electrode is disposed at another end of each of the active layer and the stop layer.

Further, the reinforcing portions are arranged in an array on the flat film.

Further, the thin film transistor further includes a passivation layer and a pixel electrode, wherein the passivation layer is disposed on the source/drain layer and completely covering the source/drain layer and the active layer, and the pixel electrode is disposed on the passivation layer and electrically connected to the drain electrode.

The invention also provides a method of fabricating a thin film transistor, including the following steps:

providing a substrate;

forming a metal film on the substrate and patterning the metal film to form a flat film, and forming a plurality of reinforcing portions on an upper surface of the flat film, wherein the flat film and the reinforcing portions constitute a gate layer; forming a dielectric layer on the flat film and the reinforcing portions, the dielectric layer completely covering the flat film and the reinforcing portions;

forming an active layer on the dielectric layer, the active layer completely covering the dielectric layer; and forming a metal film on the active layer, and patterning the metal film to form a source/drain layer, the source/drain layer electrically connected to the active layer, and the source/drain layer including a source electrode and a drain electrode, wherein the source electrode is disposed at one end of the active layer, and the drain electrode is disposed at another end of the active layer.

Further, the step of forming a plurality of reinforcing portions on an upper surface of the flat film specifically includes: disposing an ultra-thin aluminum oxide film template having through holes on one side of the flat film, forming the reinforcing portions through the ultra-thin aluminum oxide film template by electron beam evaporation or physical vapor deposition, and then using a sodium hydroxide solution to etch and remove the ultra-thin aluminum oxide film template.

Further, the step of forming a plurality of reinforcing portions on an upper surface of the flat film specifically includes: coating a photoresist layer on the flat film, forming through holes on the photoresist layer by exposure and development, forming the reinforcing portions in the through holes by electron beam evaporation or physical vapor deposition, and then removing the photoresist layer by cleaning.

Further, after the step of forming the active layer and before the step of forming the source/drain layer, further including: forming a stop layer on the active layer; wherein, in the step of forming the source/drain layer, the source electrode is disposed at one end of each of the active layer and the stop layer, and the drain electrode is disposed on another end of each of the active layer and the stop layer.

The present invention also provides a display panel including the above-mentioned thin film transistor.

An advantageous effect of the present invention is to provide a thin film transistor, a display panel, and a method of fabricating a thin film transistor, in which by changing a structure of a gate of the thin film transistor, an area occupied by the flat film is reduced without impacting conductivity of the active layer, such that transmittance of the display panel is increased, and a parasitic capacitance of the display panel is reduced, thus improving the performance of the thin film transistor and the display panel.

Figure 1:
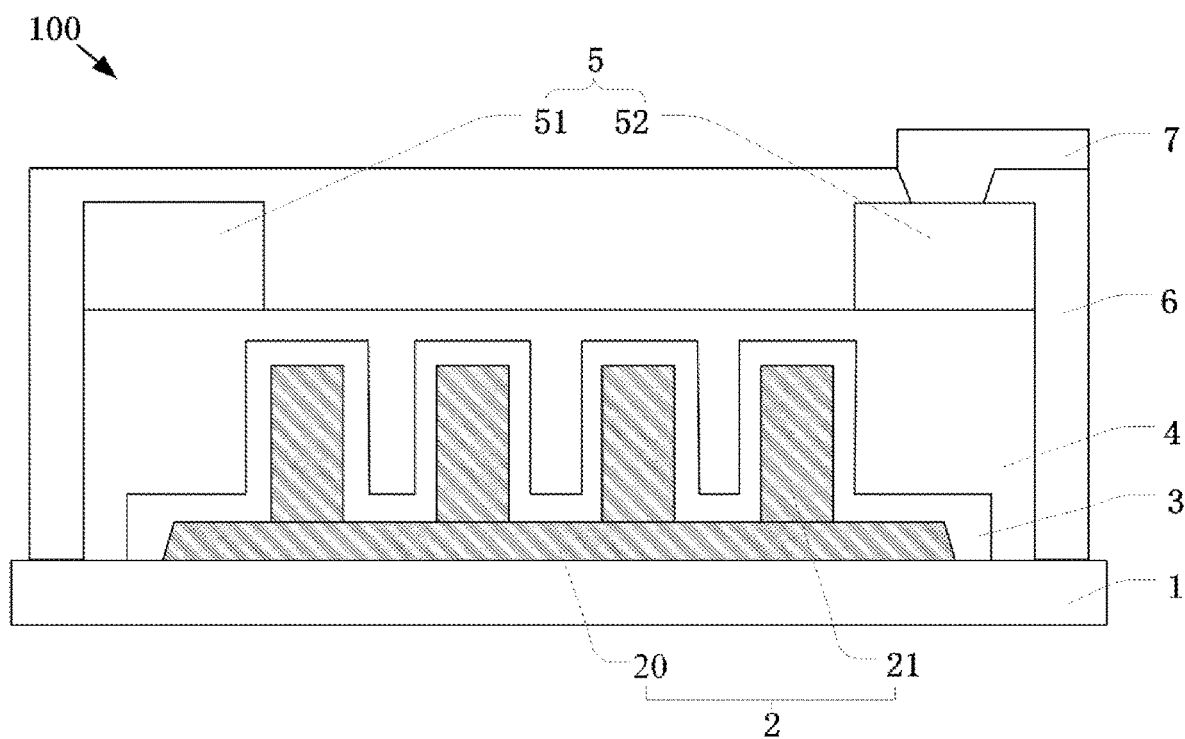
FIG. 1 is a schematic structural view of an array substrate according to a first embodiment of the present invention.

Elements in the drawings are designated by reference numerals listed below. 1: substrate, 2: gate layer, 3: dielectric layer, 4: active layer, 5: source/drain layer, 6: passivation layer, 7: pixel electrode, 8: ultra-thin aluminum oxide film template, 9: stop layer, 20: flat film, 21: reinforcing portions, 51: source electrode, 52: drain electrode, 81: first through hole, 100: thin film transistor.

DESCRIPTION OF SPECIFIC EMBODIMENTS OF THE INVENTION

Please refer to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

Embodiment 1

Referring to FIG. 1, a thin film transistor 100 provided in the Embodiment 1 of the present invention is a back channel etch type (BCE) structure including a substrate 1, a flat film 20, a dielectric layer 3, an active layer 4, and a source/drain layer 5 which are stacked in sequence from bottom to top. In particular, the substrate 1 is preferably a glass substrate or a flexible substrate; the flat film 20 is disposed on the substrate 1; a plurality of reinforcing portions 21 are disposed in an upper surface of the flat film 20, wherein the flat film 20 and the reinforcing portions 21 constitute a gate layer 2; the dielectric layer 3 is disposed on the flat film 20 and the reinforcing portions 21 and completely covers the flat film 20 and the reinforcing portions 21, and the dielectric layer 3 functions to insulate the flat film 20; the dielectric layer 3 may be made of material including $HfO_2$, $SiO_2$, SiNx, and/or $Al_2O_3$; the active layer 4 is disposed on the dielectric layer 3 and completely covers the dielectric layer 3; the source/drain layer 5 is disposed on the active layer 4 and electrically connected to the active layer 4; and the source/drain layer 5 includes a source electrode 51 and a drain electrode 52, the source electrode 51 is disposed at one end of the active layer 4, and the drain electrode 52 is provided at another end of the active layer 4; wherein the reinforcing portions 21 are configured to increase an area of the upper surface of the flat film 20, so as to increase an effective overlapping area between the flat film 20 and the active layer 4, reduce a width and a length of the thin film transistor 100, and reduce a parasitic capacitance of the thin film transistor 100. This embodiment reduces an area occupied by the flat film 20 without impacting conductivity of the active layer 4 by providing reinforcing portions 21 to increase an effective bonding area with an active layer 4, such that transmittance of the display panel is increased, and a parasitic capacitance is reduced, thus improving the performance of the thin film transistor 100 and the display panel.

In this embodiment, by adjusting a number of the reinforcing portions 21 and a thickness of the dielectric layer 3, and by regulating the active layer 4 through controlling an external voltage of the flat film 20, performance of the thin film transistor 100 can be effectively ensured. In addition, in this embodiment, the effective overlapping area between the reinforcing portions 21 and the active layer 4 can be adjusted by controlling a height of the reinforcing portions 21, so that the area occupied by the flat film 20 can be further reduced, and thus a width and a length of the thin film transistor 100 are thereby reduced. As such, the transmittance of the display panel is improved, and the parasitic capacitance of the thin film transistor 100 is reduced, without impacting the conductivity of the active layer 4.

The active layer 4 is made of material including at least one of indium gallium zinc oxide (IGZO), single crystalline silicon, low temperature poly-silicon (LTPS), and low temperature polycrystalline oxide (LTPO). Therefore, the thin film transistor 100 of the present invention can be applied to various types of devices such as amorphous silicon, IGZO, carbon nanotubes, and the like and applied to various structures such as back channel etch type (BCE) structures, etch stop layer (ESL) structures, and the like.

In this embodiment, the reinforcing portions 21 are arranged in an array on the flat film 20, thereby increasing the effective overlapping area between the flat film 20 and the active layer 4.

The reinforcing portions 21 have a shape selected from any one of a column shape, a strip shape, and a mesh shape. The reinforcing portions 21 is preferably column-shaped, more preferably cylindrical, so that the effective overlapping area between the flat film 20 and the active layer 4 can be increased, and the area occupied by the flat film 20 can be further reduced.

In this embodiment, the thin film transistor 100 further includes a passivation layer 6 and a pixel electrode 7. The passivation layer 6 is disposed on the source/drain layer 5 and completely covers the source/drain layer 5 and the active layer 4. The passivation layer 6 functions as an insulator. The pixel electrode 7 is disposed on the passivation layer 6 and electrically connected to the drain electrode 52. By providing a voltage on the pixel electrode 7, an amount of a voltage of the flat film 20 can be controlled to regulate the active layer 4, and performance of the thin film transistor 100 can be effectively ensured.

Figure 2:
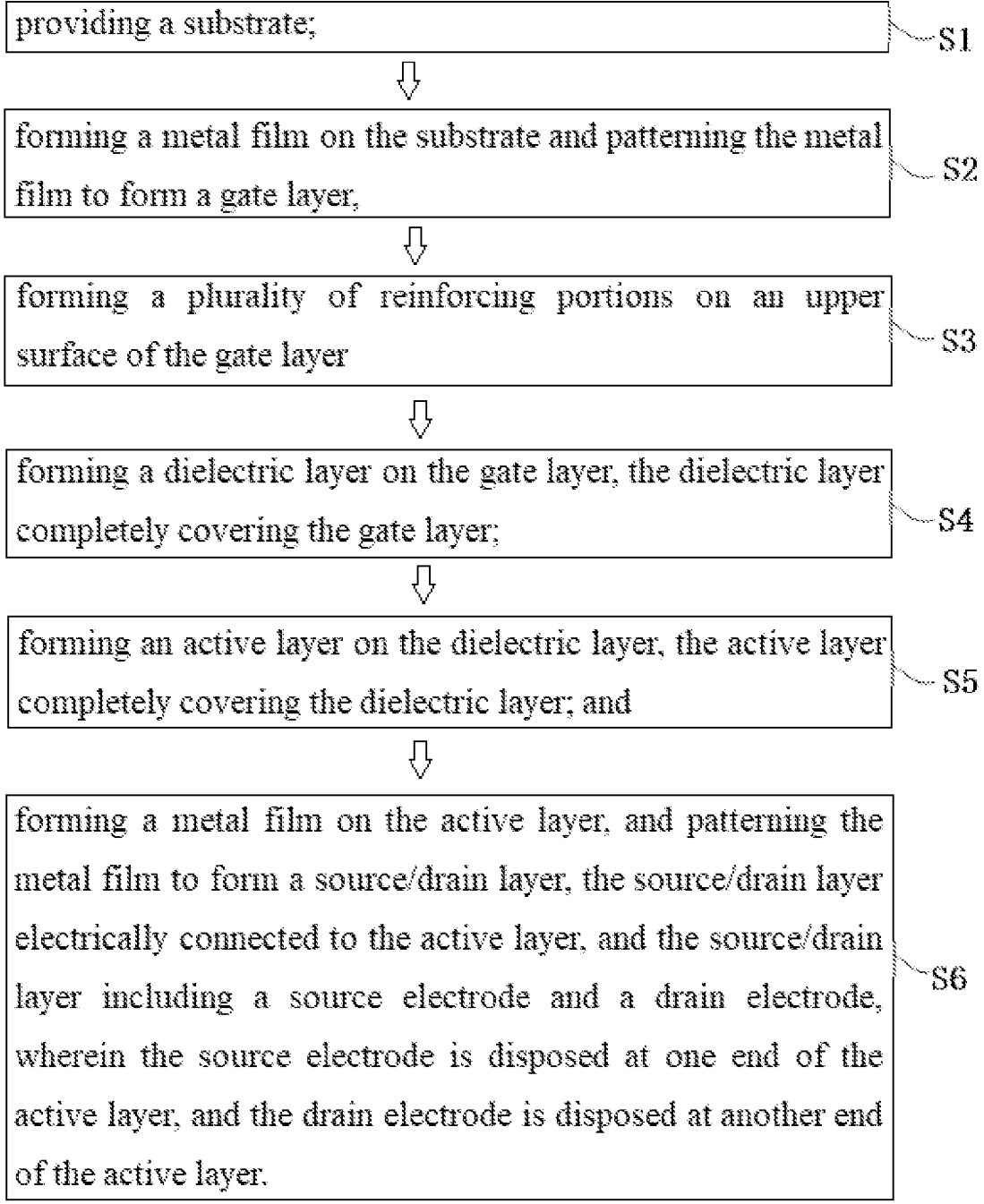
FIG. 2 is a flowchart of a method of fabricating an array substrate according to a first embodiment of the present invention.
Figure 3:
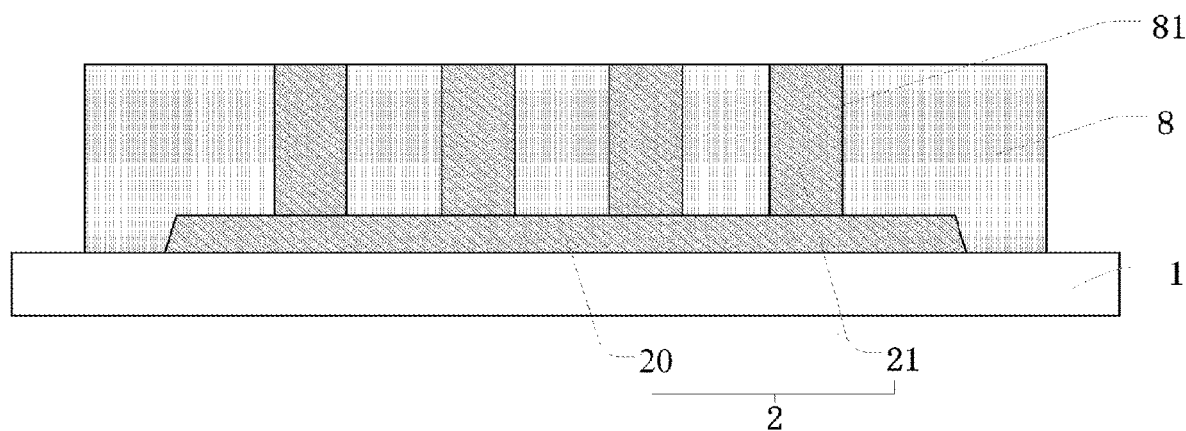
FIG. 3 is a schematic view showing a structure of a semi-finished product in a step of forming a plurality of reinforcing portions on an upper surface of the flat film in FIG. 2.

Referring to FIG. 2 and FIG. 3, the present invention further provides a method of fabricating the thin film transistor 100, including the following steps S1-S6.

S1, providing a substrate 1; the substrate 1 is preferably a glass substrate or a flexible substrate, and the flexible substrate may be made of a polymer, including polyimide (PI), polycarbonate (PC), polyethersulfone (PES), polyethylene terephthalate vinegar (PET), polyethylene naphthalate (PEN), a polyaryl compound (PAR), or glass fiber reinforced plastic (FRP).

S2, forming a metal film on the substrate 1 and patterning the metal film to form a flat film 20. The metal film is deposited on the substrate 1 preferably by physical vapor deposition (PVD) or evaporation, and then photolithography processes such as applying a photoresist or photomask, exposure, development, acid wet etching, elution, and the like, are performed to obtain the flat film 20.

S3, forming a plurality of reinforcing portions 21 on an upper surface of the flat film 20, wherein the flat film 20 and the reinforcing portions 21 constitute a gate layer 2. Preferably, the reinforcing portions 21 are arranged in an array on the flat film 20. The reinforcing portions 21 have a shape selected from any one of a column shape, a strip shape, and a mesh shape. The reinforcing portions 21 preferably have a shape of column shape, and the reinforcing portions 21 more preferably have a cylindrical shape. The reinforcing portions 21 are configured to increase an area of the upper surface of the flat film 20, so as to increase an effective overlapping area between the flat film 20 and the active layer 4, and thus the area occupied by the flat film 20 can be further reduced, reducing a width and a length of the thin film transistor 100, and reducing a parasitic capacitance of the thin film transistor 100.

S4, forming a dielectric layer 3 on the flat film 20 and the reinforcing portions 21, the dielectric layer 3 completely covering the flat film 20 and the reinforcing portions 21. Preferably, the dielectric layer 3 is formed by atomic layer deposition (ALD) or chemical vapor deposition (CVD) or thermal oxidation of a metal, and the dielectric layer 3 may be made of material including $HfO_2$, $SiO_2$, SiNx, and/or $Al_2O_3$.

S5, forming an active layer 4 on the dielectric layer 3, the active layer 4 completely covering the dielectric layer 3. Preferably, the active layer 4 is formed by inkjet printing, chemical vapor deposition, or physical vapor deposition, and then processes such as applying a photoresist, a mask exposure, development, plasma dry etching, and the like are performed to pattern the active layer 4. The active layer 4 is made of material including, but not limited to, single crystalline silicon, indium gallium zinc oxide, or carbon nanotubes.

S6, forming a metal film on the active layer 4, and patterning the metal film to form a source/drain layer 5, the source/drain layer 5 electrically connected to the active layer 4, and the source/drain layer 5 including a source electrode 51 and a drain electrode 52, wherein the source electrode 51 is disposed at one end of the active layer 4, and the drain electrode 52 is disposed at another end of the active layer 4. Preferably, the metal film is deposited by physical vapor deposition (PVD) or any vapor deposition, then processes such as applying a photoresist, exposure, development, acid wet etching, and the like, are performed to pattern the source/drain layer 5, and finally the photoresist layer is removed by cleaning.

As shown in FIG. 3, in this embodiment, The step S3 of forming a plurality of reinforcing portions 21 on the upper surface of the flat film 20 specifically includes: disposing an ultra-thin aluminum oxide film template 8 (AAO) having first through holes 81 on one side of the flat film 20, forming the reinforcing portions 21 in the first through holes 81 of the ultra-thin aluminum oxide film template 8 by electron beam evaporation or physical vapor deposition (PVD), wherein a height of the reinforcing portions 21 can be adjusted by controlling a deposition time to adjust the height of the reinforcing portions 21, and then a sodium hydroxide solution is used to etch and remove the ultra-thin aluminum oxide film template.

In other embodiments, another method of forming the reinforcing portions 21 is provided, wherein a photoresist layer (not shown) is used to replace the ultra-thin aluminum oxide film template 8. The step S3 of forming a plurality of reinforcing portions 21 on the upper surface of the flat film 20 specifically includes: coating a photoresist layer on the flat film 20, forming second through holes (not shown) on the photoresist layer by exposure and development, forming the reinforcing portions 21 in the second through holes by electron beam evaporation or physical vapor deposition, wherein a height of the reinforcing portions 21 can be adjusted by controlling a deposition time to adjust the height of the reinforcing portions 21, and then cleaning is performed to remove the photoresist layer.

The above two methods of fabricating the reinforcing portions 21 are different in that the first method uses the ultra-thin aluminum oxide film template 8, and the other method uses the photoresist layer, wherein the ultra-thin aluminum oxide film template 8 and the photoresist layer have the same structure, specifically shown in FIG. 3. The second through hole and the first through hole 81 have the same shape and size, and the reinforcing portions 21 are formed in the first through hole 81 or the second through holes by electron beam evaporation or physical vapor deposition. The first method uses a sodium hydroxide solution to etch and remove the ultra-thin aluminum oxide film template, and the other method performs cleaning to remove the photoresist layer. Both methods can adjust the height of the reinforcing portions 21 by controlling the deposition time of the reinforcing portions 21.

Embodiment 2

Figure 4:
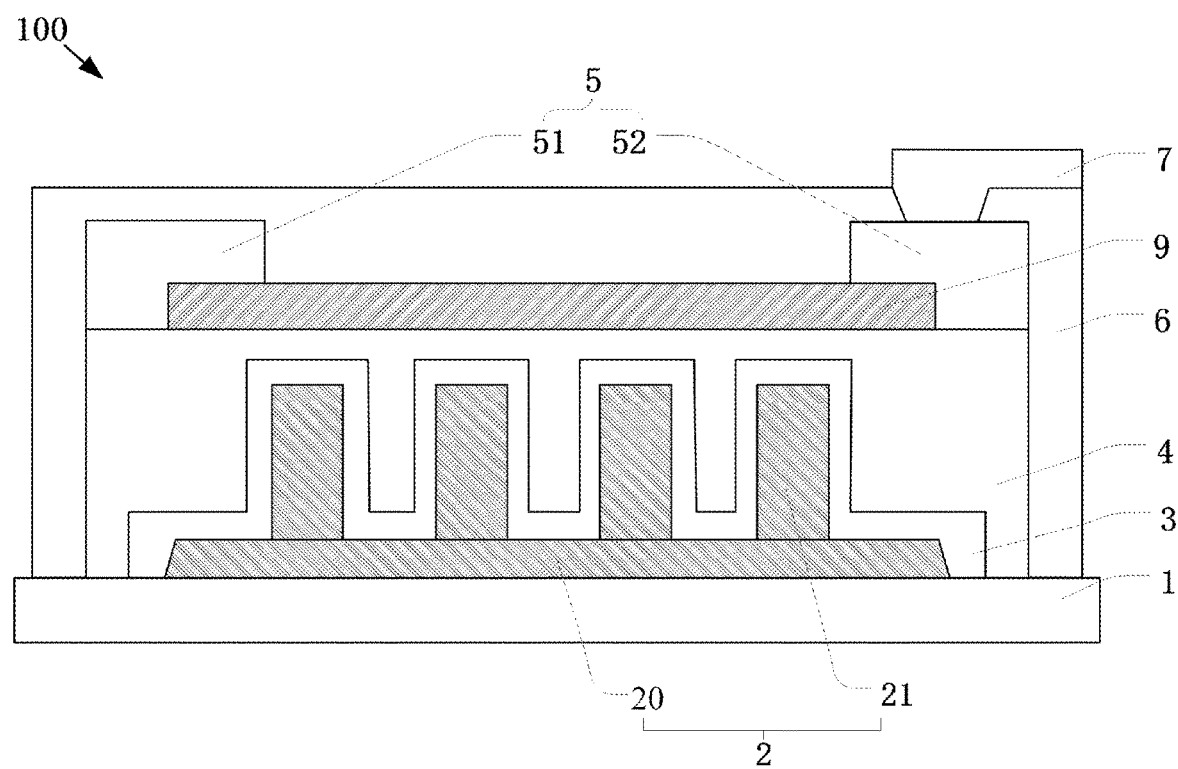
FIG. 4 is a schematic structural view of an array substrate according to a second embodiment of the present invention.

Referring to FIG. 4, all the technical features in the first embodiment are included in the second embodiment, except that the thin film transistor 100 in the second embodiment is an etch stop layer (ESL) structure, and the thin film transistor 100 further includes a stop layer 9 for protecting the underlying active layer 4, wherein the stop layer 9 is disposed on the active layer 4, the source electrode 51 is disposed one end of each of the active layer 4 and the stop layer 9, and the drain electrode 52 is disposed on another end of each of the active layer 4 and the stop layer 9.

In the second embodiment, a method of fabricating the thin film transistor 100 is further provided, which includes the steps S1 to S6 in the first embodiment. Details can be referred to the content of the Embodiment 1 and FIG. 2, and not repeated herein for brevity.

Figure 5:
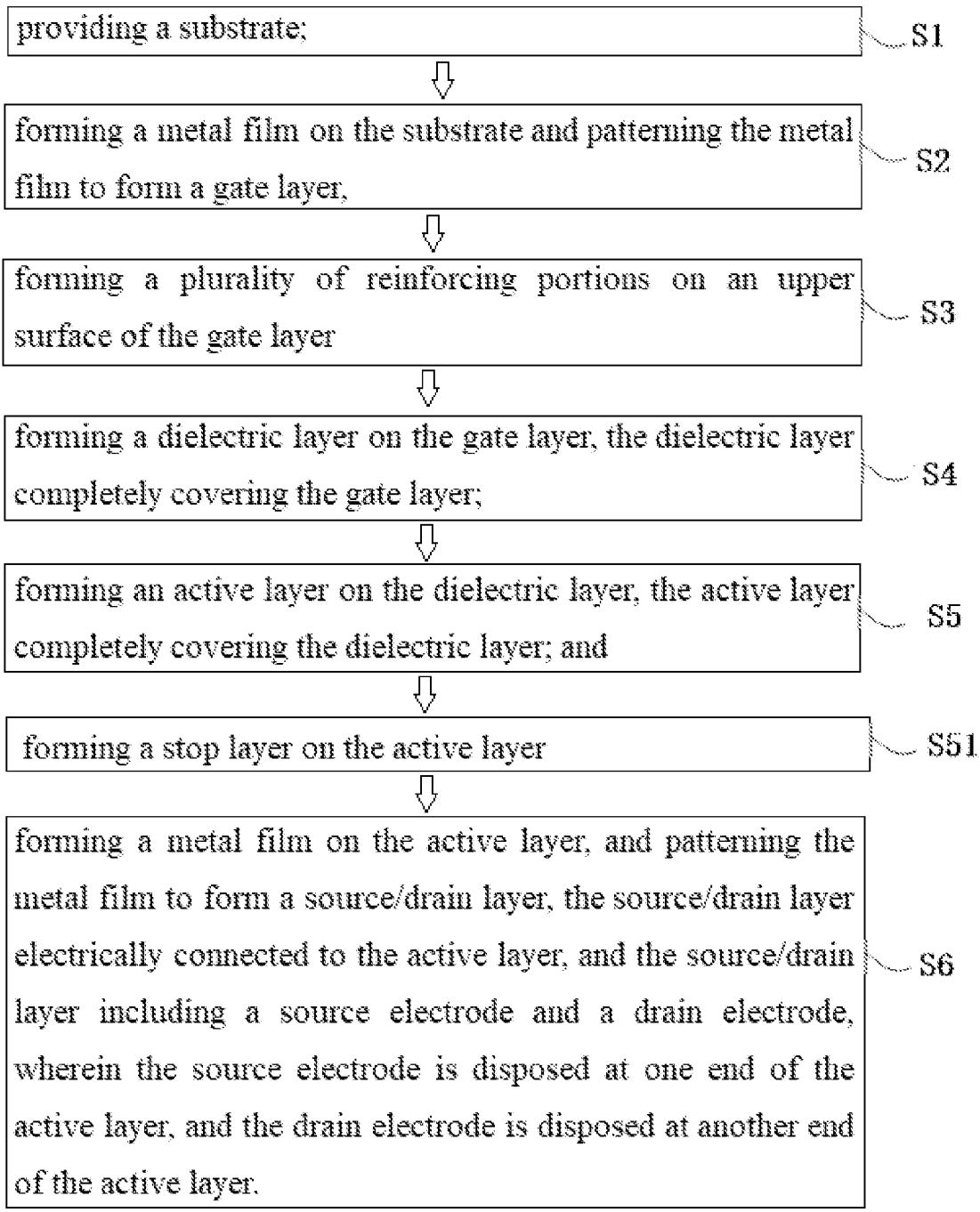
FIG. 5 is a flowchart of a method of fabricating an array substrate according to a second embodiment of the present invention.

As shown in FIG. 5, in the method of fabricating the thin film transistor 100 according to the second embodiment, after the step S5 of forming the active layer 4 and before the step S6 of forming the source/drain layer 5, the method further includes:

S51, forming a stop layer 9 on the active layer 4.

In the step S5 of forming the source/drain layer 5, the source electrode 51 is disposed at one end of each of the active layer 4 and the stop layer 9, and the drain electrode 52 is disposed on another end of each of the active layer 4 and the stop layer 9.

The present invention also provides a display panel including the above-described thin film transistor 100.

An advantageous effect of the present invention is to provide a thin film transistor 100, a display panel, and a method of fabricating the thin film transistor 100, in which by providing reinforcing portions 21 to increase an effective bonding area with an active layer 4, an area occupied by the flat film 20 is reduced without impacting conductivity of the active layer 4, such that transmittance of the display panel is increased, and a parasitic capacitance of the display panel is reduced, thus improving the performance of the thin film transistor 100 and the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A thin film transistor, comprising:
   a substrate;
   flat film disposed on the substrate,
   a plurality of reinforcing portions disposed on an upper surface of the flat film, wherein the flat film and the reinforcing portions constitute a gate layer;
   a dielectric layer disposed on the flat film and the reinforcing portions and completely covering the flat film and the reinforcing portions;
   an active layer disposed on the dielectric layer and completely covering the dielectric layer;
   a source/drain layer disposed on the active layer and electrically connected to the active layer, the source/drain layer comprising a source electrode and a drain electrode, the source electrode disposed at one end of the active layer, and the drain electrode disposed at another end of the active layer,
   wherein a top surface of the active layer directly over the reinforcing portions is level with a top surface of the active layer directly over the flat film exposed by the reinforcing portions.

2. The thin film transistor according to claim 1, wherein the reinforcing portions are arranged in an array on the flat film.

3. The thin film transistor according to claim 1, wherein the reinforcing portions have a shape selected from any one of a column shape, a strip shape, and a mesh shape.

4. The thin film transistor according to claim 1, further comprising
   an etch stop layer disposed on the active layer, wherein the source electrode is disposed at one end of each of the active layer and the etch stop layer, and the drain electrode is disposed at another end of each of the active layer and the etch stop layer.

5. The thin film transistor according to claim 1, further comprising
   a passivation layer disposed on the source/drain layer and completely covering the source/drain layer and the active layer; and
   a pixel electrode disposed on the passivation layer and electrically connected to the drain electrode.

6. A method of fabricating a thin film transistor, comprising the following steps:
   providing a substrate;
   forming a first metal film on the substrate and patterning the first metal film to form a flat film, and forming a plurality of reinforcing portions on an upper surface of the flat film; forming a dielectric layer on the flat film and the reinforcing portions, the dielectric layer completely covering the flat film and the reinforcing portions, wherein the flat film and the reinforcing portions constitute a gate layer;
   forming an active layer on the dielectric layer, the active layer completely covering the dielectric layer; and
   forming a second metal film on the active layer, and patterning the second metal film to form a source/drain layer, the source/drain layer electrically connected to the active layer, and the source/drain layer comprising a source electrode and a drain electrode, wherein the source electrode is disposed at one end of the active layer, and the drain electrode is disposed at another end of the active layer,
   wherein a top surface of the active layer directly over the reinforcing portions is level with a top surface of the active layer directly over the flat film exposed by the reinforcing portions.

7. The method of fabricating the thin film transistor according to claim 6, wherein the step of forming a plurality of reinforcing portions on an upper surface of the flat film comprises:
   disposing an ultra-thin aluminum oxide film template having through holes on one side of the flat film, forming the reinforcing portions through the ultra-thin aluminum oxide film template by electron beam evaporation or physical vapor deposition, and then using a sodium hydroxide solution to etch and remove the ultra-thin aluminum oxide film template.

8. The method of fabricating the thin film transistor according to claim 6, wherein the step of forming a plurality of reinforcing portions on an upper surface of the flat film comprises:
   coating a photoresist layer on the flat film, forming through holes on the photoresist layer by exposure and development, forming the reinforcing portions in the through holes by electron beam evaporation or physical vapor deposition, and then removing the photoresist layer by cleaning.

9. The method of fabricating the thin film transistor according to claim 6, after the step of forming the active layer and before the step of forming the source/drain layer, further comprising:
   forming an etch stop layer on the active layer;
   wherein, in the step of forming the source/drain layer, the source electrode is disposed at one end of each of the active layer and the etch stop layer, and the drain electrode is disposed on another end of each of the active layer and the etch stop layer.

10. A display panel, comprising the thin film transistor according to claim 1.

* * * * *